United States Patent
Choi et al.

(10) Patent No.: US 7,638,414 B2
(45) Date of Patent: Dec. 29, 2009

(54) METHOD OF FORMING NITRIDE SEMICONDUCTOR LAYER ON PATTERNED SUBSTRATE AND LIGHT EMITTING DIODE HAVING THE SAME

(75) Inventors: Joo Won Choi, Ansan-Si (KR); Kyoung Hoon Kim, Ansan-Si (KR); Eu Jin Hwang, Ansan-Si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 162 days.

(21) Appl. No.: 12/040,439

(22) Filed: Feb. 29, 2008

(65) Prior Publication Data
US 2008/0217647 A1    Sep. 11, 2008

(30) Foreign Application Priority Data
Mar. 6, 2007  (KR) .................. 10-2007-0022150

(51) Int. Cl.
*H01L 21/20* (2006.01)
*H01L 21/36* (2006.01)
*H01L 29/20* (2006.01)

(52) U.S. Cl. .............. 438/483; 438/46; 257/103; 257/615; 257/E33.025; 257/E33.028

(58) Field of Classification Search ............ 438/483; 257/615
See application file for complete search history.

(56) References Cited

U.S. PATENT DOCUMENTS 7,339,205 B2 * 3/2008 Piner et al. .................. 257/190

2006/0006500 A1 * 1/2006 Piner et al. .................. 257/613
2008/0067523 A1 * 3/2008 Dwilinski et al. ............. 257/76
2008/0150085 A1 * 6/2008 Dadgar et al. ............... 257/615
2008/0303032 A1 * 12/2008 Dwilinski et al. ............. 257/76

FOREIGN PATENT DOCUMENTS

DE    10223797    4/2003
EP    1641051    3/2006

OTHER PUBLICATIONS

Hyung Koun Cho, et al.; "Microstructural analysis of GaN films grown by a two-step technique on patterned GaN and sapphire" Superlattices and Microstructures, vol. 36, 2004, pp. 385-391, Elsevier Ltd.

* cited by examiner

*Primary Examiner*—David A Zarneke
(74) *Attorney, Agent, or Firm*—H.C. Park & Associates, PLC

(57) ABSTRACT

A method of forming high quality nitride semiconductor layers on a patterned substrate and a light emitting diode having the same are disclosed. After forming a nucleation layer on the patterned substrate, a first 3D and 2D growth layers are formed thereon in this order by growing nitride semiconductor layers in 3D and 2D growth conditions. Then, a second 3D growth layer is formed on the first 2D growth layer by growing a nitride semiconductor layer in another 3D growth condition, and a second 2D growth layer is formed on the second 3D growth layer by growing a nitride semiconductor layer in another 2D growth condition. As such, the thickness of the 3D growth layer can be reduced by alternately forming the 3D and 2D growth layers, thereby preventing the 3D growth layer from having a rough surface and improving crystal quality of the final 2D growth layer.

12 Claims, 2 Drawing Sheets

METHOD OF FORMING NITRIDE SEMICONDUCTOR LAYER ON PATTERNED SUBSTRATE AND LIGHT EMITTING DIODE HAVING THE SAME

RELATED APPLICATIONS

This application claims priority from Korean Patent Application No. 10-2007-0022150 filed on Mar. 6, 2007, in the Korean Intellectual Property Office, the disclosure of which is incorporated herein by reference in its entirety.

FIELD OF THE INVENTION

The present invention relates to a method of forming a semiconductor layer on a substrate and a light emitting diode (LED) having the same. More particularly, the present invention relates to a method of forming a nitride semiconductor layer on a patterned substrate and a light emitting diode having the same.

BACKGROUND OF THE INVENTION

Light emitting diode technologies have been significantly changed by development of GaN-based light emitting diodes, which are currently applied to various fields, such as full color LED displays, LED traffic signal systems, white LEDs, etc.

Recently, it is expected that highly efficient white LEDs will replace fluorescent lamps, and efficiency of white LEDs is approaching the level of typical fluorescent lamps. However, there is still a need for further improvement in the efficiency of LEDs.

In order to improve the efficiency of LEDs, two main approaches are proposed in the art: one is to increase internal quantum efficiency that is determined by crystal quality and epitaxial layer structure, and the other is to increase light extraction efficiency.

As a technique for increasing the light extraction efficiency, there is a patterned sapphire substrate-based technique, as described in "InGaN-based Near-Ultraviolet and Blue Light Emitting Diodes with High External Quantum Efficiency Using a Patterned Sapphire Substrate and a Mesh Electrode" (Japanese Journal of Applied Physics, Vol. 41, pp. L1431-L1433), published on Dec. 15, 2002).

According to this technique, a sapphire substrate is etched to have a pattern of convex hexagons and is then formed with nitride semiconductor layers to manufacture a light emitting diode, which may have improved light extraction efficiency through reduction of light loss caused by total internal reflection between the nitride semiconductor layers and the substrate.

However, the patterned sapphire substrate has many growth planes, and, when nitride semiconductors grown on the respective growth planes meet together to form the semiconductor layer, a relatively large amount of defects such as pin holes can be formed in the semiconductor layer. The pin holes disadvantageously affect growth of nitride semiconductor layers, for example, active layers, to be formed on the semiconductor layer, and reduce internal quantum efficiency of LED while causing current leakage during operation of the LED, thereby deteriorating brightness and reliability of the LED.

To solve the problems as described above, a method of continuously growing a nitride semiconductor layer on a patterned sapphire substrate in 3D and 2D growth conditions is generally used.

FIG. 1 is a cross-sectional view illustrating a conventional method of forming a nitride semiconductor layer on a patterned sapphire substrate.

Referring to FIG. 1, a nucleation layer 13 is formed on a patterned sapphire substrate 11. The substrate 11 is processed to have a pattern of islands 11a and a substantially flat base surface on a recess region between the islands 11a. The nucleation layer 13 is preferentially grown on the flat base surface and covers the base surface.

Then, a 3D growth layer 15 is formed on the nucleation layer 13 of the substrate 11 by growing a nitride semiconductor layer thereon in a 3D growth condition. Here, the term "3D growth condition" means a condition wherein vertical growth is faster than lateral growth due to a lower mobility of atoms during growth of the nitride semiconductor layer. The 3D growth layer 15 fills the recess regions on the substrate 11 and covers the islands 11a.

Then, a 2D growth layer 17 is formed on the 3D growth layer 15 by growing a nitride semiconductor layer thereon in a 2D growth condition. Here, the term "2D growth condition" means a condition wherein lateral growth is faster than vertical growth due to a higher mobility of atoms during growth of the nitride semiconductor layer. On the 2D growth layer 17, a first conductive semiconductor layer, an active layer, and a second conductive semiconductor layer (not shown) are grown, thereby forming a light emitting diode. Here, the nucleation layer 13, 3D growth layer 15, and 2D growth layer 17 can be formed by MOCVD.

According to the conventional technique, since the 2D growth layer 17 is formed on the 3D growth layer 15 filling the recess regions on the substrate surface, the 2D growth layer 17 can be grown without any influence of the growth planes on the substrate. Accordingly, it is possible to suppress generation of the pin holes, which could be formed when the 2D growth layers continue to grow and meet one another during growth of the 2D growth layer 17 directly on the nucleation layer 14. However, since the 3D growth layer 15 must be formed relatively thick to fill the recess regions of the substrate 11, the 3D growth layer 15 has a significantly rough surface. When the 2D growth layer 17 is formed on the 3D growth layer 15 having the rough surface, lots of pin holes are formed not only on an interface between the 3D growth layer 15 and the 2D growth layer 17, but also inside the 2D growth layer 17.

The present invention is conceived to solve the problems of the conventional techniques as described above, and an aspect of the present invention is to provide a method of forming a high quality nitride semiconductor layer on a patterned substrate.

Another aspect of the present invention is to provide a method of forming a nitride semiconductor layer on a patterned substrate, in which the nitride semiconductor layer can suppress generation of pin holes.

A further aspect of the present invention is to provide a light emitting diode, which has nitride semiconductor layers formed on a patterned substrate to ensure high brightness and reliability of the light emitting diode, and a method of manufacturing the same.

In accordance with one aspect of the present invention, a method of forming a nitride semiconductor layer on a patterned substrate is provided. The method comprises preparing a patterned substrate having a pattern of protrusions and recess regions. A nucleation layer is formed on the patterned substrate and a first 3D growth layer is formed on the substrate having the nucleation layer by growing a nitride semiconductor layer in a 3D growth condition. Then, a first 2D growth layer is formed on the first 3D growth layer by growing a nitride semiconductor layer in a 2D growth condition. Next, a second 3D growth layer is formed on the first 2D growth layer by growing a nitride semiconductor layer in a 3D growth condition, and a second 2D growth layer is formed on the second 3D growth layer by growing a nitride semiconductor layer in a 2D growth condition.

Here, the term "3D growth condition" means a condition wherein vertical growth is faster than lateral growth due to a lower mobility of atoms during growth of the nitride semiconductor layer. In the 3D growth condition, the nitride semiconductor layer grows fast in the vertical direction and has a rough surface. On the other hand, the term "2D growth condition" means a condition wherein lateral growth is faster than vertical growth due to a higher mobility of atoms during growth of the nitride semiconductor layer. In the 2D growth condition, the nitride semiconductor layer grows so as to have a flat surface.

According to embodiments of the present invention, the 3D growth condition for growing the first 3D growth layer is set to have a substrate temperature (T1) in the range of 600~1,200° C. and a chamber pressure (P1) in the range of 10~760 mbar. Further, the 2D growth condition for growing the first 2D growth layer is set to have a substrate temperature (T2) higher than T1 and a chamber pressure (P2) lower than P1. Further, the 3D growth condition for growing the second 3D growth layer is set to have a substrate temperature (T3) lower than T2 and a chamber pressure (P3) higher than P2. Additionally, the 2D growth condition for growing the second 2D growth layer is set to have a substrate temperature (T4) higher than T3 and a chamber pressure (P4) lower than P3.

According to the embodiments of the present invention, since the thickness of the 3D growth layer can be reduced by alternately forming the 3D growth layers and the 2D growth layers, it is possible to prevent the 3D growth layers from having rough surfaces and to thereby improve crystal quality of a final 2D growth layer.

Further, even when a 3D growth layer is formed thick and has a rough surface, a 2D growth layer and another 3D layer are previously formed before the final 2D growth layer, thereby preventing pin holes from being formed in the final 2D growth layer due to the rough surface thereof.

In the meantime, the first 3D and 2D growth layers may be formed in the recess regions of the substrate to have upper surfaces located below the pattern of protrusions. In addition, the second 3D growth layer may be formed to have an upper surface located at least above the pattern of protrusions. Unlike the conventional technique where the recess regions of the patterned substrate are filled with a single 3D growth layer, the present method fills the recess regions of the patterned substrate with the 3D growth layer and 2D growth layer, thereby preventing the 3D growth layer from being formed to have a rough surface.

The present method may further comprise alternately forming an additional 3D growth layer and an additional 2D growth layer at least once on the substrate, on which the first 2D growth layer is formed, before forming the second 3D growth layer. In other words, the 3D growth layers and 2D growth layers may be repetitively grown, thereby preventing the 3D growth layers from having the rough surface even when the depths of the recess regions of the patterned substrate increase.

A growth condition for the additional 3D growth layer is set to have a lower substrate temperature and a higher chamber pressure than those for the 2D growth layer formed under the additional 3D growth layer, and, a growth condition for the additional 2D growth layer is set to have a higher substrate temperature and a lower chamber pressure than those for the additional 3D growth layer formed under the additional 2D growth layer.

A first conductive semiconductor layer, an active layer, and a second conductive semiconductor layer may be formed on the second 2D growth layer. Then, a light emitting diode is manufactured by patterning the first conductive semiconductor layer, active layer, and second conductive semiconductor layer.

In accordance with another aspect of the present invention, a light emitting diode comprises a substrate that is patterned to have a pattern of protrusions and recess regions. The light emitting diode comprises a nucleation layer covering base surfaces of the recess regions of the substrate. A first 3D growth layer of a nitride semiconductor layer grown in a 3D growth condition is positioned on the nucleation layer, and a first 2D growth layer of a nitride semiconductor layer grown in a 2D growth condition is positioned on the first 3D growth layer. Further, a second 3D growth layer of a nitride semiconductor layer grown in a 3D growth condition is positioned on the first 2D growth layer, and a second 2D growth layer of a nitride semiconductor layer grown in a 2D growth condition is positioned on the second 3D growth layer.

The first 3D growth layer is the nitride semiconductor layer grown on the nucleation layer in a 3D growth condition set to have a substrate temperature (T1) in the range of 600~1,200° C. and a chamber pressure (P1) in the range of 10~760 mbar. Further, the first 2D growth layer is the nitride semiconductor layer grown on the first 3D growth layer in a 2D growth condition set to have a substrate temperature (T2) higher than T1 and a chamber pressure (P2) lower than P1. Further, the second 3D growth layer is the nitride semiconductor layer grown on the first 2D growth layer in a 3D growth condition set to have a substrate temperature (T3) lower than T2 and a chamber pressure (P3) higher than P2. Additionally, the second 2D growth layer is the nitride semiconductor layer grown on the second 3D growth layer in a 2D growth condition set to have a substrate temperature (T4) higher than T3 and a chamber pressure (P4) lower than P3.

Additionally, a first conductive semiconductor layer is positioned on the second 2D growth layer and a second conductive semiconductor layer is positioned on the first conductive layer. Further, an active layer is interposed between the first and second conductive semiconductor layers.

According to this aspect of the present invention, since the second 2D growth layer having excellent crystal quality is provided to the light emitting diode, the semiconductor layers formed on the second 2D growth layer also have improved crystal quality, thereby ensuring the light emitting diode has excellent internal quantum efficiency.

In the meantime, the first 3D growth layer and the first 2D growth layer may be positioned in the recess regions of the substrate, with their upper surfaces located below the pattern of protrusions. In addition, an upper surface of the second 3D growth layer may be located at least above the pattern of protrusions. Accordingly, the thickness of the 3D growth layer can be reduced by filling the recess regions of the patterned substrate with the 3D growth layer and the 2D growth layer, thereby enabling reduction in surface roughness of the 3D growth layer.

Moreover, at least one pair of additional 3D and 2D growth layers may be interposed between the first 2D growth layer and the second 3D growth layer. The additional 3D growth layer is formed at a lower substrate temperature and a higher chamber pressure than those for the 2D growth layer formed under the additional 3D growth layer, and the additional 2D growth layer is formed at a higher substrate temperature and a lower chamber pressure than those for the additional 3D growth layer formed under the additional 2D growth layer. Therefore, it is possible to further reduce the thickness of the 3D growth layer.

DESCRIPTION OF THE DRAWINGS

The above and other objects, features and advantages of the present invention will become apparent from the following description of preferred embodiments given in conjunction with the accompanying drawings, in which.

DETAILED DESCRIPTION

Figure 1:
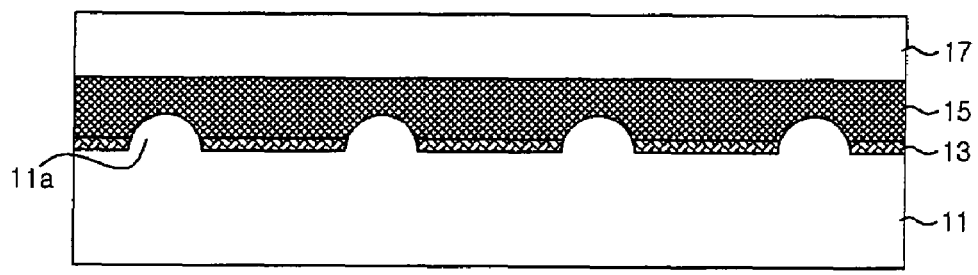
FIG. 1 is a cross-sectional view illustrating a conventional method of forming a nitride semiconductor layer on a patterned sapphire substrate.

Exemplary embodiments of the present invention will be described in detail with reference to the accompanying drawings hereinafter. The following embodiments are given by way of illustration only to help those skilled in the art fully understand the spirit of the present invention. Hence, it should be noted that the present invention is not limited to the embodiments described herein and can be realized in various forms. Further, the drawings are not to precise scale and components therein may be exaggerated in view of thickness, width, length, etc. Herein, similar or identical reference numerals will denote similar or identical components throughout the drawings.

Figure 2:
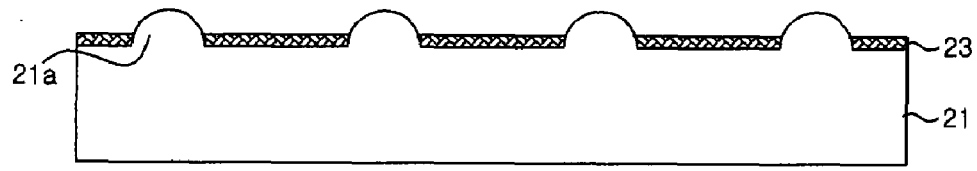
FIGS. 2 and 3 are cross-sectional views illustrating a method of forming a nitride semiconductor layer on a patterned sapphire substrate according to one embodiment of the present invention.
Figure 3:
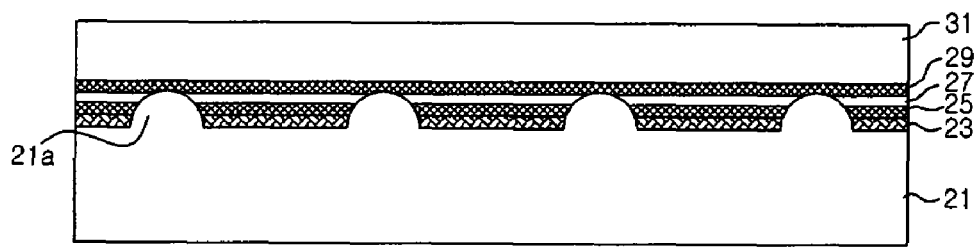

FIGS. 2 and 3 are cross-sectional views illustrating a method of forming a nitride semiconductor layer on a patterned sapphire substrate according to one embodiment of the present invention. Herein, the nitride semiconductor layer will be described as being formed by means of MOCVD. However, it should be understood that the present invention is not limited to MOCVD, and that other techniques such as MBE and the like can be used.

Referring to FIG. 2, a patterned substrate 21 is first prepared. The substrate 21 may include, but is not limited to, a sapphire substrate, a SiC substrate, and the like. The patterned substrate 21 has a pattern of protrusions 21a and recess regions formed thereon. The pattern of protrusions 21 may be a mesh-shaped pattern, and more preferably a pattern of islands. Additionally, each of the recess regions has a substantially planar base surface, as shown in the figure.

A nucleation layer 23 is formed on the patterned substrate 21. The nucleation layer 23 may be formed of a GaN-based semiconductor layer, for example, (Al, In, Ga)N, at a temperature of 400~600° C. The nucleation layer 23 is mainly formed on the base surfaces of the recess regions of the substrate.

Referring to FIG. 3, a first 3D growth layer 25 is formed on the substrate having the nucleation layer 23 by growing a nitride semiconductor layer in a 3D growth condition. The 3D growth condition is set to have a substrate temperature (T1) in the range of 600~1,200° C. and a chamber pressure (P1) in the range of 10~760 mbar.

The thickness of the first 3D growth layer 25 is not particularly limited. The first 3D growth layer 25 may be formed to cover the pattern of protrusions 21a as described with reference to FIG. 1. In this case, the first 3D growth layer 25 can be formed to have a rough surface. Preferably, the 3D growth layer 25 is formed in the recess regions of the substrate to have an upper surface located below the pattern of protrusions 21a. Hence the 3D growth layer 25 is formed to have a relatively thin thickness, which prevents the surface of the 3D growth layer from becoming rough.

A first 2D growth layer 27 is formed on the first 3D growth layer 25 by growing a nitride semiconductor layer in a 2D growth condition. A substrate temperature (T2) and a chamber pressure (P2) of the 2D growth condition are set to be higher than T1 and lower than P1, respectively. Therefore, a relatively flat 2D growth layer 27 is formed on the first 3D growth layer 25, thereby relieving surface roughness.

The thickness of the first 2D growth layer 27 is not particularly limited. The first 2D growth layer 27, however, is preferably formed to have an upper surface also located below the pattern of protrusions 21a when the upper surface of the first 3D growth layer 25 is located below the pattern of protrusions 21a. As a result, growing parts of the first 2D growth layer 27 are prevented from meeting on the pattern of protrusions 21a after being separately grown on the recess regions.

The substrate temperature (T2) and the chamber pressure (P2) are higher than T1 and lower than P1, and may be in the range of 600~1,200° C. and in the range of 10~760 mbar, respectively.

Next, a second 3D growth layer 29 is formed on the first 2D growth layer 27 by growing a nitride semiconductor layer in a 3D growth condition. The second 3D growth layer 29 is formed to cover the pattern of protrusions 21a, thereby providing a continuous upper surface. A substrate temperature (T3) and a chamber pressure (P3) of the 3D growth condition for the second 3D growth layer 29 are set to be lower than T2 and higher than P2. Alternatively, the second 3D growth layer 29 may be formed at the same temperature and pressure as those of the first 3D growth layer 25.

Then, a second 2D growth layer 31 is formed on the second 3D growth layer 29 by growing a nitride semiconductor layer in a 2D growth condition. A substrate temperature (T4) and a chamber pressure (P4) of the 2D growth condition for the second 2D growth layer 31 are set to be higher than T3 and lower than P3. Since the second 2D growth layer 31 is formed on the second 3D growth layer having a relieved surface roughness as compared to the conventional technique, generation of pin holes in the second 2D growth layer is suppressed and thereby the second 2D growth layer has excellent crystal quality.

Although the present embodiment is illustrated as having the 3D growth layers and 2D growth layers formed alternately twice, the present invention is not limited to this configuration, and alternate formation of the 3D growth layer and 2D growth layer may be performed more repetitively. For example, alternate formation of the 3D growth layer and the 2D growth layer may be additionally performed at least once before forming the second 3D growth layer 29. At this time, the substrate temperature and the chamber pressure for forming the additional 3D growth layer are set to be lower than the temperature and higher than the pressure of the growth condition for growing the 2D growth layer formed under the additional 3D growth layer, respectively. Further, the substrate temperature and the chamber pressure for forming the additional 2D growth layer are set to be higher than the temperature and lower than the pressure of the growth condition for growing the 3D growth layer formed under the additional 2D growth layer, respectively.

According to this embodiment, the surface roughness of the 3D growth layer can be relieved by alternately and repetitively forming the 3D growth layers and the 2D growth layers, thereby improving crystal quality of the final 2D growth layer.

Figure 4:
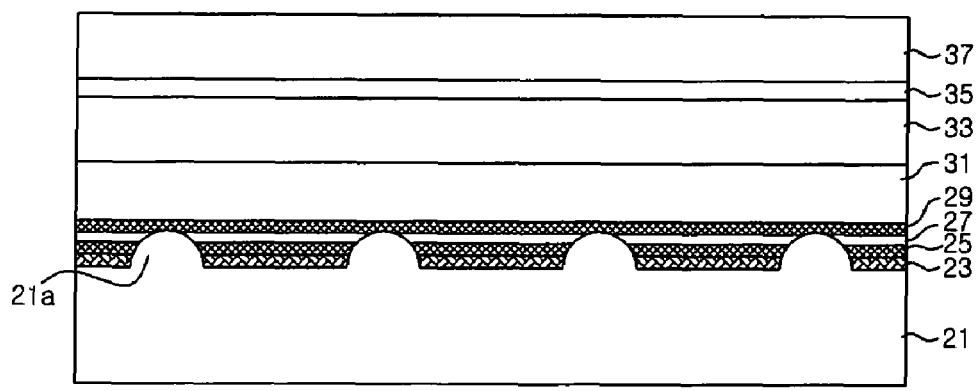
FIGS. 4 and 5 are cross-sectional views illustrating a method of manufacturing a light emitting diode according to one embodiment of the present invention.
Figure 5:
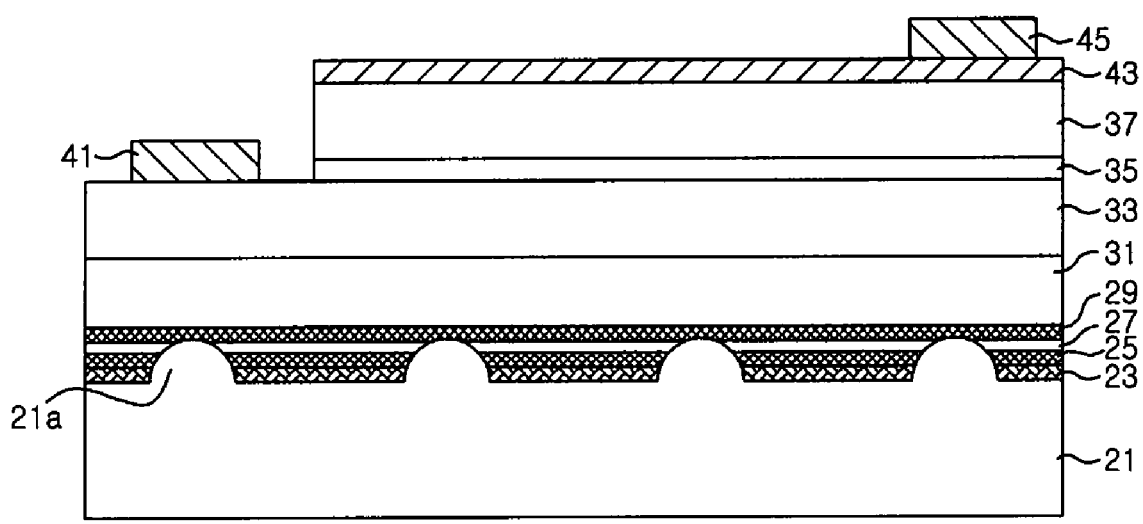

FIGS. 4 and 5 are cross-sectional views illustrating a method of manufacturing a light emitting diode according to one embodiment of the present invention.

Referring to FIG. 4, a first conductive semiconductor layer 33, an active layer 35, and a second conductive semiconductor layer 37 are formed on a second 2D growth layer 31 that is formed as described in FIGS. 2 and 3. The first and second conductive semiconductor layers 33 and 37 and the active layer 35 can be formed by means of MOCVD as in 3D and 2D growth layers, and can be formed in-situ within the same chamber.

Referring to FIG. 5, a predetermined region of the first conductive semiconductor layer 33 is exposed by patterning the second conductive semiconductor layer 37 and the active layer 35. Further, a first electrode pad 41 is formed on the exposed first conductive semiconductor layer 33, and a transparent electrode layer 43 and a second electrode pad 45 are then formed on the second conductive semiconductor layer 37, thereby providing a light emitting diode.

According to this embodiment, since the first and second conductive semiconductor layers 33 and 37 and the active layer 35 are formed on the second 2D growth layer 31 having excellent crystal quality, the first and second conductive semiconductor layers 33 and 37 and the active layer 35 have improved crystal quality, which results in improved internal quantum efficiency and prevents pin hole induced current leakage. Therefore, the light emitting diode has improved brightness and reliability.

As apparent from the above descriptions, the present invention provides a method capable of forming a high quality nitride semiconductor layer on a patterned substrate while suppressing generation of pin holes in the nitride semiconductor layer. Furthermore, the present invention provides a light emitting diode that has high brightness and reliability by growing the nitride semiconductor layer on the patterned substrate.

Although the exemplary embodiments have been described with reference to the accompanying drawings, it should be noted that the present invention is not limited to the embodiments and the drawings, and that various modifications and changes can be made by those skilled in the art without departing from the spirit and scope of the present invention as defined by the accompanying claims.

The invention claimed is:

1. A method of forming a nitride semiconductor layer on a patterned substrate, comprising:
preparing a patterned substrate having a pattern of protrusions and recess regions;
forming a nucleation layer on the patterned substrate;
forming a first 3D growth layer on the substrate having the nucleation layer by growing a nitride semiconductor layer in a 3D growth condition;
forming a first 2D growth layer on the first 3D growth layer by growing a nitride semiconductor layer in a 2D growth condition;
forming a second 3D growth layer on the first 2D growth layer by growing a nitride semiconductor layer in a 3D growth condition; and
forming a second 2D growth layer on the second 3D growth layer by growing a nitride semiconductor layer in a 2D growth condition,
wherein the 3D growth condition for growing the first 3D growth layer is set to have a substrate temperature (T1) in the range of 600~1,200° C. and a chamber pressure (P1) in the range of 10~760 mbar;
wherein the 2D growth condition for growing the first 2D growth layer is set to have a substrate temperature (T2) higher than T1 and a chamber pressure (P2) lower than P1;
wherein the 3D growth condition for growing the second 3D growth layer is set to have a substrate temperature (T3) lower than T2 and a chamber pressure (P3) higher than P2; and
wherein the 2D growth condition for growing the second 2D growth layer is set to have a substrate temperature (T4) higher than T3 and a chamber pressure (P4) lower than P3.

2. The method according to claim 1, wherein the first 3D and 2D growth layers are formed in the recess regions of the substrate to have upper surfaces located below the pattern of protrusions.

3. The method according to claim 2, wherein the second 3D growth layer is formed to have an upper surface located at least above the pattern of protrusions.

4. The method according to claim 1, wherein the second 3D growth layer is formed to have an upper surface located at least above the pattern of protrusions.

5. The method according to claim 1, further comprising:
alternately forming an additional 3D growth layer and an additional 2D growth layer at least once on the substrate, on which the first 2D growth layer is formed, before forming the second 3D growth layer,
wherein a growth condition for the additional 3D growth layer is set to have a lower substrate temperature and a higher chamber pressure than those for the 2D growth layer formed under the additional 3D growth layer; and
wherein a growth condition for the additional 2D growth layer is set to have a higher substrate temperature and a lower chamber pressure than those for the additional 3D growth layer formed under the additional 2D growth layer.

6. The method according to claim 1, further comprising:
forming a first conductive semiconductor layer, an active layer, and a second conductive semiconductor layer on the second 2D growth layer.

7. A light emitting diode comprising:
a substrate patterned to have a pattern of protrusions and recess regions;
a nucleation layer covering base surfaces of the recess regions of the substrate;
a first 3D growth layer of a nitride semiconductor layer grown on the nucleation layer in a 3D growth condition set to have a substrate temperature (T1) in the range of 600~1,200° C. and a chamber pressure (P1) in the range of 10~760 mbar;
a first 2D growth layer of a nitride semiconductor layer grown on the first 3D growth layer in a 2D growth condition set to have a substrate temperature (T2) higher than T1 and a chamber pressure (P2) lower than P1;
a second 3D growth layer of a nitride semiconductor layer grown on the first 2D growth layer in a 3D growth condition set to have a substrate temperature (T3) lower than T2 and a chamber pressure (P3) higher than P2; and
a second 2D growth layer of a nitride semiconductor layer grown on the second 3D growth layer in a 2D growth condition set to have a substrate temperature (T4) higher than T3 and a chamber pressure (P4) lower than P3.

8. The light emitting diode according to claim 7, further comprising:
a first conductive semiconductor layer on the second 2D growth layer;

a second conductive semiconductor layer on the first conductive layer; and an active layer interposed between the first and second conductive semiconductor layers.

9. The light emitting diode according to claim 7, wherein the first 3D and 2D growth layers are formed in the recess regions of the substrate to have upper surfaces located below the pattern of protrusions.

10. The light emitting diode according to claim 9, wherein the second 3D growth layer is formed to have an upper surface located at least above the pattern of protrusions.

11. The light emitting diode according to claim 7, wherein the second 3D growth layer is formed to have an upper surface located at least above the pattern of protrusions.

12. The light emitting diode according to claim 7, further comprising:
- at least one pair of an additional 3D growth layer and an additional 2D growth layer interposed between the first 2D growth layer and the second 3D growth layer;
- wherein the additional 3D growth layer is grown at a lower substrate temperature and a higher chamber pressure than those for the 2D growth layer formed under the additional 3D growth layer; and
- wherein the additional 2D growth layer is grown at a higher substrate temperature and a lower chamber pressure than those for the additional 3D growth layer formed under the additional 2D growth layer.

* * * * *